United States Patent
Adiga et al.

(10) Patent No.: US 9,760,462 B2
(45) Date of Patent: *Sep. 12, 2017

(54) TESTING OPTIMIZATION OF MICROPROCESSOR TABLE FUNCTIONS

(71) Applicant: International Business Machines Corporation, Armonk, NY (US)

(72) Inventors: Narasimha R. Adiga, Karnataka (IN); Jatin Bhartia, Uttar Pradesh (IN); Akash V. Giri, Austin, TX (US); Matthias D. Heizmann, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 457 days.

This patent is subject to a terminal disclaimer.

(21) Appl. No.: 14/501,377

(22) Filed: Sep. 30, 2014

(65) Prior Publication Data

US 2015/0309905 A1    Oct. 29, 2015

Related U.S. Application Data

(63) Continuation of application No. 14/261,619, filed on Apr. 25, 2014, now Pat. No. 9,304,883.

(51) Int. Cl.
*G06F 11/00* (2006.01)
*G06F 11/263* (2006.01)
(Continued)

(52) U.S. Cl.
CPC ........ *G06F 11/263* (2013.01); *G06F 11/2236* (2013.01); *G11C 2029/0401* (2013.01)

(58) Field of Classification Search
CPC .......................... G06F 11/2236; G06F 11/263
See application file for complete search history.

(56) References Cited

U.S. PATENT DOCUMENTS 6,813,740 B1    11/2004 Lejeune
9,304,883 B2 *    4/2016 Adiga ................... G06F 11/263
(Continued)

OTHER PUBLICATIONS

Adiga, Narasimha R. et al., Pending Applicaiton entitled: "Testing Optimization of Microprocessor Table Functions" U.S. Appl. No. 14/261,619, filed with the U.S. Patent and Trademark Office on Apr. 25, 2014.

(Continued)

*Primary Examiner* — Charles Ehne
(74) *Attorney, Agent, or Firm* — Cantor Colburn LLP; Margaret A. McNamara

(57) ABSTRACT

Embodiments relate to testing memory write operations. An aspect includes detecting a first write operation to a set of "n" divisions in a memory table, and defining a selected set of entries of an optimization checking table corresponding to the set of "n" divisions of the memory table. The aspect includes determining that at least one selected entry of the selected set of entries is not among an optimal set of entries of the checking table. The aspect further includes determining whether to generate an optimization error or to end an optimization analysis of the first write operation without generating the optimization error by comparing the first time stamps of one or both of the at least one selected entry and one or more optimal entries of the optimal set of entries to a temporal window defined by a predetermined duration.

13 Claims, 6 Drawing Sheets

(51) Int. Cl.
*G06F 11/22* (2006.01)
*G11C 29/04* (2006.01)

(56) References Cited

U.S. PATENT DOCUMENTS

2015/0309904 A1* 10/2015 Adiga .................. G06F 11/263
                                                                             714/32
2015/0309905 A1    10/2015 Adiga et al.

OTHER PUBLICATIONS

List of IBM Patents or Patent Applictions Treated as Related; (Appendix P), Filed Mar. 23, 2017 2 pages.

* cited by examiner

| Column Number | Column Name | Last used time stamp | Previous last used time stamp |
|---|---|---|---|
| 0 | ColA | 550 | 0 |
| 1 | ColB | 550 | 0 |
| 2 | ColC | 510 | 0 |
| 3 | ColD | 950 | 500 |
| 4 | ColE | 900 | 500 |
| 5 | ColF | 800 | 500 |

FIG. 2B

| Column Number | Column Name | Last used time stamp | Previous last used time stamp |
|---|---|---|---|
| 0 | ColA | 1112 | 1000 |
| 1 | ColB | 1112 | 955 |
| 2 | ColC | 1110 | 955 |
| 3 | ColD | 0, Inval at cyc 1114 | 1110 |
| 4 | ColE | 1113 | 1110 |
| 5 | ColF | 1112 | 1104 |

TESTING OPTIMIZATION OF MICROPROCESSOR TABLE FUNCTIONS

DOMESTIC PRIORITY

This application is a continuation application of the legally related U.S. Ser. No. 14/261,619 filed Apr. 25, 2014, the contents of which are incorporated by reference herein in their entirety.

BACKGROUND

The present invention relates generally to microprocessor table write operations, and more specifically, to testing the optimization of microprocessor table functions.

Most microprocessors include arrays or tables consisting of multiple rows and columns, which are used to provide access to data at faster speeds than from off-chip storage. The tables are limited in size and encompass only a subset of the most recently used data, and the data may be organized according to least recently used (LRU) and most recently used (MRU) data, or information regarding the LRU and MRU data may be stored in the table or other memory locations. Typically, the cell data of the least recently used column of a row in a table is replaced by the most recent write operation. When there is a data write operation, cell data (row address, column number) might have to be replaced unless the current cell data is invalid. It has been proven to be most efficient to replace the data of the least recently used cell in this row (row address). To achieve this some hardware designs use a full LRU/MRU replacement strategy. Various systems with varying levels of complexity have been devised to implement LRU/MRU designs in microprocessors.

However, the verification of LRU/MRU designs increases in complexity as the complexity of the LRU/MRU design increases. In addition, a verification system that mirrors LRU/MRU hardware design too closely becomes less robust and loses generic qualities that would allow the verification system to be used with multiple LRU/MRU designs.

SUMMARY

Embodiments include a computer program product and method for testing optimization of a microprocessor table function. One aspect includes storing in memory a checking table including a plurality of entries based on divisions of a memory table, the divisions including at least one of columns and rows, and the divisions of the memory table corresponding to data stored in memory having been used in processing operations. The checking table includes a first time stamp for each of the entries, the first time stamp corresponding to a time the divisions of the memory table were last written to. The checking table further includes a second time stamp for each of the entries of the checking table, the second time stamp corresponding to a penultimate time the divisions of the memory table were written to. The aspect includes detecting, by a processing circuit, a first write operation to a set of "n" divisions in the memory table, and defining a selected set of entries of the checking table corresponding to the set of "n" divisions of the memory table. The aspect includes determining, by the processing circuit, that at least one selected entry of the selected set of entries is not among an optimal set of entries of the checking table, the optimal set of entries including at least the "n" oldest entries of the checking table and every entry having a first time stamp equal to a newest one of the "n" oldest entries. The aspect includes, based on determining that the at least one selected entry is not among the optimal set of entries, determining whether to generate an optimization error or to end an optimization analysis of the first write operation without generating the optimization error by comparing the first time stamps of one or both of the at least one selected entry and one or more optimal entries of the optimal set of entries to a temporal window defined by a predetermined duration.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIG. 2B depicts the validation table having different values in accordance with an embodiment;

DETAILED DESCRIPTION

Microprocessors write to tables to provide rapid access to frequently-used data. A typical problem for verification of data write operations in hardware, and in particular to tables and other local memory in a microprocessor, is that a verification system requires accurate data regarding the state of the hardware. However, simply making copies of hardware states for verification can be difficult and can slow processing. Embodiments relate to testing microprocessor write operations using a temporal window to verify efficient write operations.

Figure 1:
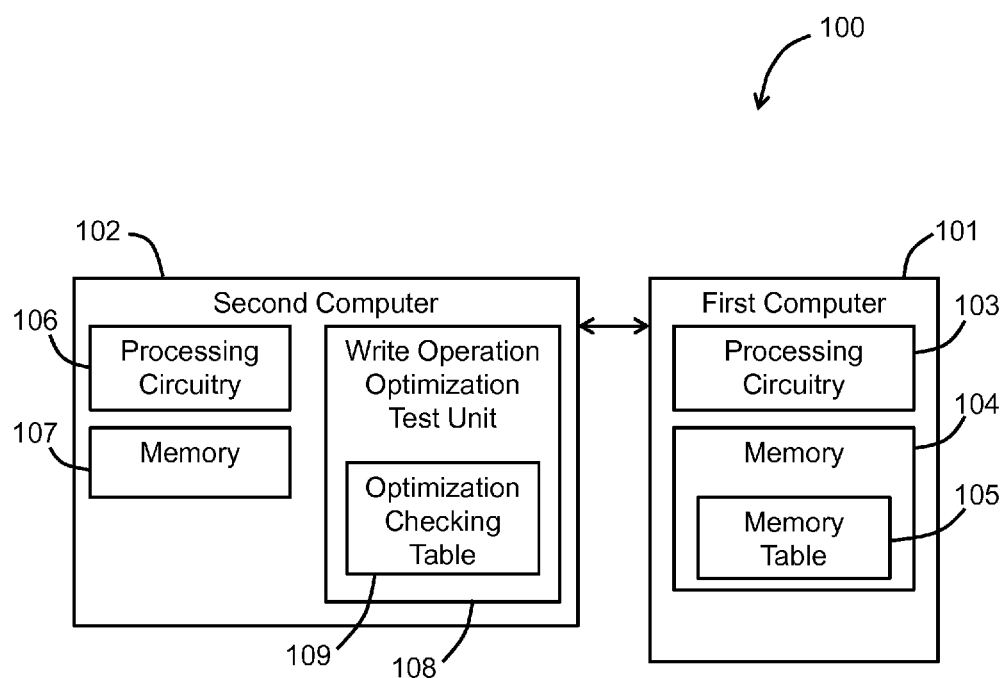
FIG. 1 depicts a testing system in accordance with an embodiment.

Turning now to FIG. 1, a testing system 100 is generally shown. The system includes a first computer 101 and a second computer 102. The first computer 101 includes processing circuitry 103 and memory 104. The memory has stored therein a memory 105 for providing rapid access to most recently used data. In the present specification, the term "memory" is used in a general sense to encompass any device or structure capable of storing data, including registers, cache memory, volatile memory, and non-volatile memory. In one embodiment, both the processing circuitry 103 and the memory 104 are part of the same microprocessor. While the computer 101 is illustrated with only the processing circuitry 103 and memory 104 for purposes of description, embodiments encompass computers having a variety of processing circuits and memory, including microprocessors, multi-threading processors, memory-on-processors, separate memory, volatile memory, non-volatile memory, logic circuitry, field-programmable gate arrays, passive electrical components, and any other circuitry for reading and writing data to and from memory 104, including the memory table 105 in memory 104.

The system 100 further includes a second computer 102. The second computer 102 includes processing circuitry 106, memory 107 and a write operation optimization test unit 108. The write operation optimization test unit 108 may be software stored in memory 107 and executed by the processing circuitry 106 configured to monitor write operations of the first computer 101 and verify the optimization of the write operations or generate error notices or signals when the write operations do not satisfy predetermined criteria. The write operation optimization test unit 108 includes an optimization checking table 109. In one embodiment, the optimization checking table 109 includes entries corresponding to divisions of the memory table 105, such as rows or columns of the memory table 105. The optimization checking table further includes first and second time stamps, corresponding to the last time a division of the memory table 105 was written to and the penultimate time the division was written to, respectively.

While the write operation optimization test unit 108 is illustrated as being independent for the processing circuitry 106 and memory 107 for purposes of description, it is understood that embodiments encompass a write operation optimization test unit 108 which may be a software program or combination of software and hardware that monitors, by the processing circuitry 106, write operations of the first computer 101 and writes, by the processing circuitry 106, to memory 107 a table or other data structure representing the table 105 of the first computer 101. In addition, while the memory table 105 is illustrated in FIG. 1 for purposes of description, embodiments of the invention encompass any segments of memory 104 divided according to any predetermined pattern or structure.

While the first computer 101 and the second computer 102 are represented by different boxes, and may be located in different physical structures, housings, or cases, embodiments also encompass systems 100 having the first and second computers 101 and 102 within the same structure, shell, housing, or computer case. The first computer 101 and second computer 102 may share processing circuitry 103 and 106 or may have independent processing circuitry 103 and 106 and memory 104 and 107. In one embodiment, the memory table 105 or other data structures tested by the write operation optimization test unit 108 are stored in hardware in the first computer 101 and replicated by software in the second computer 102, the software being stored in memory 107.

Figure 2A:
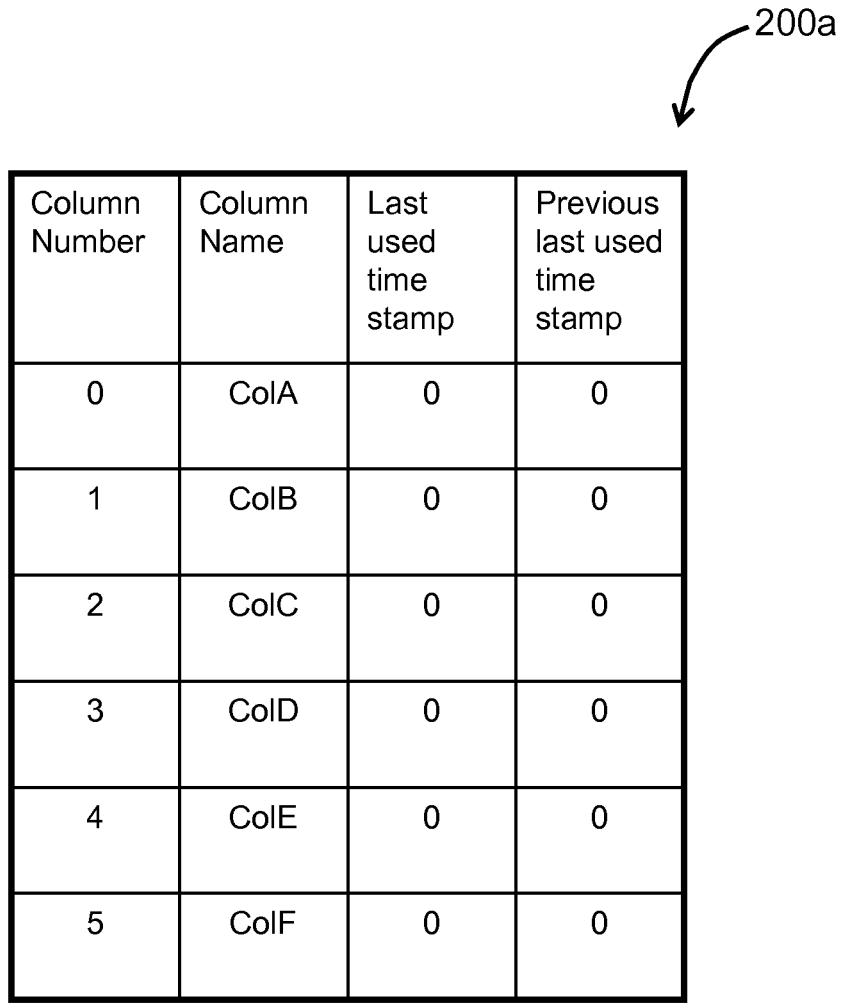
FIG. 2A depicts a validation table in accordance with an embodiment.
Figure 2C:
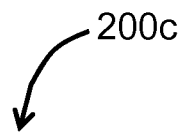
FIG. 2C depicts the validation table having different values in accordance with an embodiment.
Figure 3:
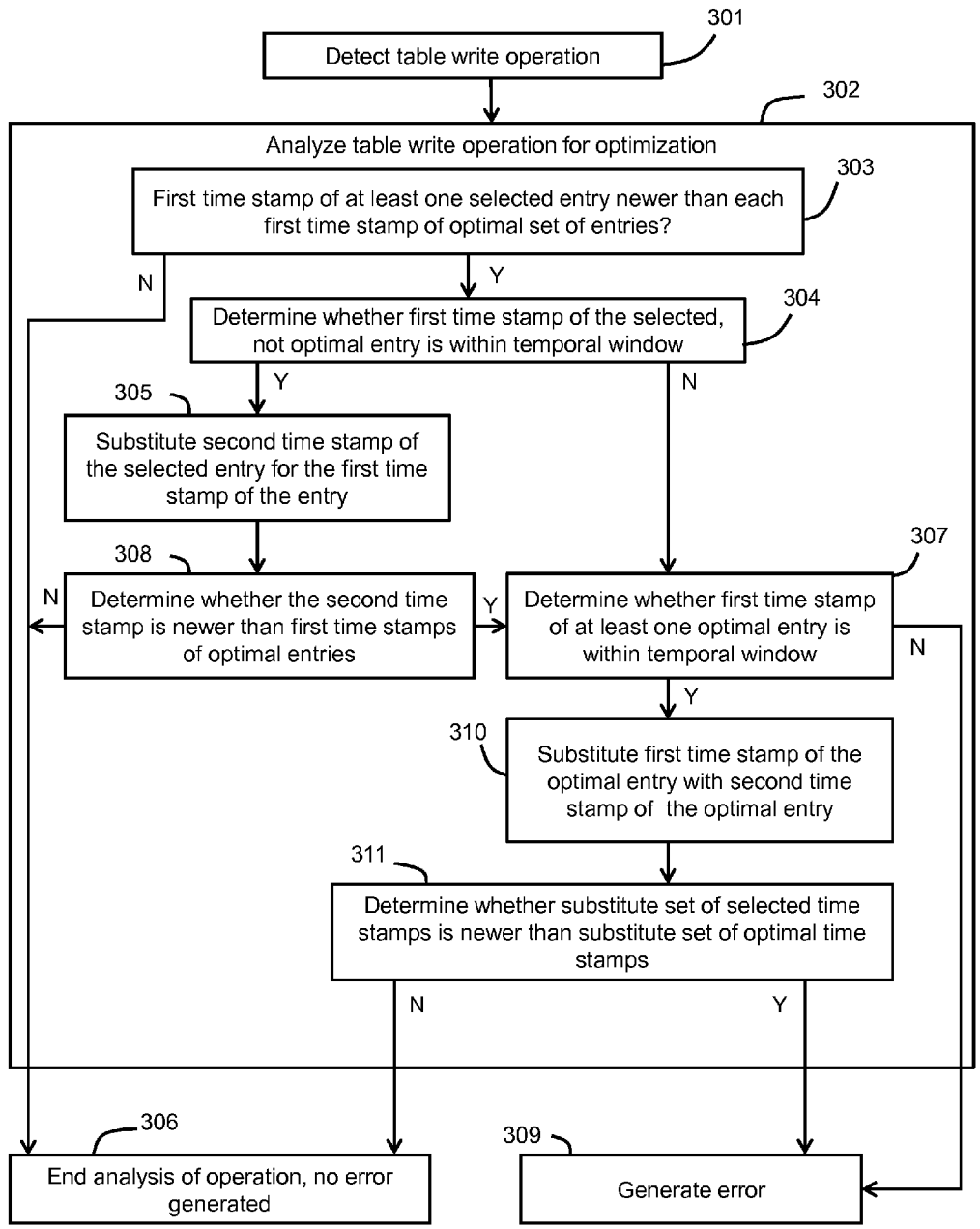
FIG. 3 depicts a process flow for testing the optimization of microprocessor write operations in accordance with an embodiment.

FIG. 2A to 2C represent tables, graphs, or data structures generated or stored by the write operation optimization test unit 108 to test the write operations of the first computer 101. FIG. 3 illustrates a flow diagram of a method of testing the optimization of write operations to the table 105 of the first computer 101 according to an embodiment.

Referring to FIG. 2A, the checking table 200a generated or stored by the write operation optimization test unit 108 includes rows 0 to 5 representing columns A to F of the table 105 of the first computer 101. Each row 0 to 5 has an associated first time stamp, or "last-used" time stamp, identifying the last time the column A to F was written to by the first computer 101. Each row 0 to 5 also has a second time stamp or "previous last-used" time stamp, identifying the penultimate time that the respective column A to F was written to by the first computer 101, or in other words, the time immediately before the last time that the column A to F was written to. In embodiments, one of the column name and number is referred to as an entry in the row or column of the checking table 200a, and the first and second time stamps correspond to the columns identified by the entry.

Each row or column of the checking table 200a corresponds to a separate row or column of the table 105, such that the time stamps in each row or column of the checking table 200a are updated independently based on write operations to corresponding divisions (such as rows or columns) of a memory table. For example, if two columns, ColA and ColB, of a memory table are written to in a microprocessor, the checking table would update the "last used time stamp" to reflect the time that the columns ColA and ColB were written to, while leaving the time stamps corresponding to the remaining columns unchanged.

In an initial state in which none of the columns A to F have been written to, the first and second time stamps all have values of "0." Referring to FIG. 3, in block 301, the write operation optimization test unit 108 detects a write operation performed by the first computer 101. In particular, the write operation test unit detects a write operation to the memory table 105. The write operation may be the result of data being accessed by the microprocessor, and the data being stored in the memory table 105 as most-recently-used data.

In block 302, the write operation test unit analyzes the write operation to determine whether the write operation is optimized, or writing to the optimal columns or rows of the memory table based on predetermined optimization criteria, such as faster data access times to data used most frequently or most recently.

FIG. 2B represents a checking table 200b generated by the write operation optimization test unit 108 to store data related to write operations of the first computer 101 related to the table 105. As illustrated in FIG. 2B, columns A and B were each written to in one or more write operations at clock cycle 550. Column C was last written two in a write operation at clock cycle 510. None of columns A, B, and C have a value for the second time stamp, indicating that only one write operation has been performed on columns A, B, and C. Column D has a first time stamp of 950, column E has a first time stamp of 900, and column F has a first time stamp of 800. Columns D, E, and F all have a second time stamp of 500, indicating that the previous write operation to these columns occurred in one or more write operations at clock cycle 500.

Referring to FIG. 3, in block 303, the write operation optimization test unit 108 determines whether the first time stamp of a selected set of entries is newer than (or conversely, the same or older than) an optimal set of entries. In embodiments, the selected set of entries is defined as the set of entries in the checking table 109 (See FIG. 1) corresponding to the divisions written to in the memory table 105 (See FIG. 1). For example, if a write operation replaces the data in columns A and B of the memory table 105, the selected set of entries would be columns 0 and 1 of FIGS. 2A to 2C, which correspond to columns A and B of the memory table 105. In addition, in embodiments the optimal set of entries is defined as a set of entries having a number at least equal to the number of divisions written to in the memory table 105, including the oldest entries of the memory table 105, and including every entry having a same first time stamp value as the newest optimal entry. For example, referring to FIG. 2A in which every entry has a first time stamp of 0, if a write operation were performed in columns C and D of a memory table, the columns 2 and 3 of the checking table 200a would be the selected set of entries and all of the columns 0 to 5 of the checking table 200a would be the optimal set of entries, since every entry has the same value for the first time stamp. In another example, referring to FIG. 2B, if a write operation occurred in columns C and D of a memory table, then columns 2 and 3 would be the selected set of entries of the checking table 200b, and columns 0 to 2 would be the optimal set of entries, since the optimal set of entries must include the oldest entries and every entry having the same first time stamp value as the newest optimal entry. Since column 2 is the entry having the first time stamp with the oldest value (510), and since columns 0 and 1 are the entries having the next-oldest values (550), the optimal set of entries includes all three entries (cols. 0, 1, and 2).

While embodiments are described in terms of "sets" of entries, it is understood that a set includes any number of entries from one entry to every entry in a table. For example, if only one division of a memory table is written to, then the selected set would have a size of only one.

Continuing in reference to FIG. 3, if it is determined in block 303 that each first time stamp of the selected set of entries is older than or the same as each first time stamp of the optimal set of entries, or in other words if no first time stamp of the selected set of entries is newer than a first time stamp of the optimal set of entries, the process proceeds to block 306, in which the optimization analysis of the memory table write operation ends and no error is generated. On the other hand, if it is determined in block 303 that at least one selected entry, or in other words at least one entry of the selected set of entries, has a first time stamp newer than a first time stamp of the optimal set of entries, the process continues to block 304.

For example, referring to FIG. 2B, the write operation optimization test unit 108 may detect a write operation to column B of a memory table at clock cycle 955. In block 303, the write operation optimization test unit 108 would determine that the first time stamp of column B is 550, but there is an older time stamp at column C (value of 510). Therefore, the process would proceed to block 304.

In another example, the write operation optimization test unit 108 may detect a write operation to columns C and D of a memory table at clock cycle 955. Columns 2 and 3 of the checking table 200b would be the selected set of entries, since columns 2 and 3 of the checking table 200b correspond to columns C and D of the memory table. In addition, columns 0 to 2 would be the optimal set of entries, since these columns define the set of entries having the two oldest first time stamp values (i.e. 510 and 550). In block 303, the write operation optimization test unit 108 would detect that the first time stamp of column 2 (i.e. 510) is among the time stamp values of the optimal set of entries (i.e. 510 and 550), but that the first time stamp of column 3 (i.e. 950) is newer than the time stamp values of the optimal set of entries. Therefore, the process would proceed to block 304.

In block 304, the write operation optimization test unit 108 determines whether the first time stamp of the selected entry having the first time stamp value outside the values of the optimal set of entries is within a temporal window, defined as a window having a predetermined time duration. In one embodiment, the temporal window is defined by a predetermined number of clock cycles. In one embodiment, the temporal window is between around 5 clock cycles and around 20 clock cycles. If it is determined that the first time stamp of the selected entry is within the temporal window 304, the process proceeds to block 305. Otherwise, the process proceeds to block 307.

In one embodiment in which a set of selected entries includes multiple entries, the process may proceed to block 307 if any one of the multiple entries has a first time stamp that is not within the temporal window. For example, in a write operation directed to two columns of a memory table corresponding to two columns of the checking table, the process may proceed to block 307 if both columns have first time stamp values newer than the first time stamps of an optimal set of entries, and only one of the columns has a first time stamp value within the temporal window.

In another example, in an embodiment in which the temporal window is 10 clock cycles and the write operation occurs in column B at clock cycle 955, the write operation optimization test unit 108 would determine that the first time stamp of column B is not within the temporal window (defined as the present clock cycle 955 minus the predetermined duration, 10 clock cycles, or defined as a window between clock cycle 945 and 955). Since the temporal window extends only to clock cycle 945 and the first time stamp of column B is at 550, the first time stamp falls outside the temporal window and the process proceeds to block 307.

In an alternate example in which the temporal window is 10 clock cycles and the write operation occurs in column D at clock cycle 950, the write operation optimization test unit 108 would detect that the first time stamp of column D (clock cycle 950) is within the temporal window (between clock cycle 945 and clock cycle 955), and the process would proceed to block 305.

In block 305, a second time stamp of selected entries is substituted for the first time stamp. In particular, the second time stamp of the selected entry that falls inside the temporal window is used to replace the first time stamp of the selected entry. In one embodiment, a set of time stamps of selected entries is converted into a substitute set of time stamps of the selected entries, including first time stamps that are the same or younger than first time stamps of the optimal entries and second time stamps of selected entries that have first time stamps younger than an optimal entry and that fall within the temporal window. In other words, the substitute set of selected time stamps may be a mix of first and second time stamps.

In block 308, the write operation optimization test unit 108 analyzes the second time stamp of the selected entry to determine whether the second time stamp of the selected entry is newer than the first time stamps of the optimal entries among the optimal set of entries. If so, then the process proceeds to block 307. If not, then the optimization analysis of the first write operation ends and no error is generated. In other words, if the second time stamps of the one or more selected entries having first time stamps newer than the first time stamps of the optimal entries are equal to or older than the first time stamps of the optimal entries, the write optimization test unit 108 may end the optimization analysis of the write operation without generating an error.

For example, referring to FIG. 2B, in the example in which column 3 of the checking table 200b is the selected entry, the corresponding column D of a memory table was written to at clock cycle 955, and the temporal window is 10 clock cycles, the write operation optimization test unit 108 substitutes the second time stamp (i.e. 500) of column 3 for the first time stamp (i.e. 950). The write operation optimization test unit 108 then compares the second time stamp with the first time stamp of the optimal entry, or column 2. Since the second time stamp of column 3 is older than the first time stamp of column 2, the process would proceed to block 306, ending the optimization analysis and generating no optimization error.

In another example, a write operation may replace the data in columns C, D, and E of a memory table at clock cycle 955, which correspond to columns 2, 3, and 4 of the FIG. 2B, the write operation optimization test unit 108 would substitute the second time stamp (i.e. 500) of column 3 for the first time stamp (i.e. 950). However, since the first time stamp of column 4 (i.e. 900) is not within the temporal window (i.e.

ten clock cycles), the time stamps for column 4 may not be substituted. In such an embodiment, the write operation optimization test unit 108 may proceed to block 308 to continue the optimization analysis.

In an alternative embodiment, if it is determined in block 304 that any of the first time stamps of the selected set of entries is within the temporal window, all of the first time stamps of the selected set of entries may be substituted, for purposes of optimization analysis, by the second time stamps of the selected set of entries. In yet another embodiment, if any of the first time stamps of the selected set of entries is determined to be within the temporal window, the optimization test process may end without substituting the second time stamps for the first time stamps. In yet another embodiment, if all the first time stamps of the selected set of entries are determined to be within the temporal window, the optimization test process may end without substituting the second time stamps for the first time stamps.

As discussed previously, if it is determined in block 308 that one or more of the substituted second time stamps of the selected entries is newer than the first time stamps of the optimal entries, the process proceeds to block 307. In the example described above, in which a write operation designates the data in columns C, D, and E of a memory table for replacement, the set of time stamps of the selected columns is {510 (Col. 2); 500 (Col. 3, substitute); and 900 (Col. 4), while the set of optimal time entries is {510 (Col. 2); 550 (Col. 1); and 550 (Col. 0)}. Since one of the time entries of the substitute set of selected time entries is newer than one or more of the optimal time entries (in this case, the time 900 associated with Col. 4 is newer than the time entries for all of columns 0, 1, and 2), the process proceeds to block 307.

In block 307, the write operation optimization test unit 108 determines whether the first time stamps of the optimal entries fall within the temporal window. If none of the first time stamps of the optimal entries that are not among the selected set of time entries falls within the temporal window, an optimization error is generated in block 309. In other words, if every one of the first time stamps of the optimal time entries that is not among the set of selected time entries is outside the temporal window, the process proceeds to block 309. On the other hand, if one or more of the first time stamps of the optimal entries falls within the temporal window, the process proceeds to block 310.

In one embodiment, only a subset of the optimal entries are analyzed in block 307 to determine whether the first time stamps fall within the temporal window. For example, if only two of the optimal entries have first time stamp values that are older than the time stamp values of every one of the selected entries, then the process may include determining whether the first time stamp values of only the two optimal entries falls within the temporal window. In an alternative embodiment, the first time stamp values of all of the optimal entries are analyzed to determine whether the first time stamps fall within the temporal window.

In block 310, the second time stamp of the optimal entries is substituted for the first time stamp. In one embodiment, the second time stamps of only the optimal entries having first time stamps in the temporal window are substituted for the first time stamps. In another embodiment, the second time stamps of all of the optimal entries are substituted for the first time entries.

While an embodiment has been described in which second time stamps of optimal entries are substituted for first time stamps, according to an alternative embodiment, the optimization analysis process ends with no error being generated when one or more optimal entries are determined to have first time stamps in the temporal window.

In block 311, the write operation optimization test unit 108 analyzes a substitute set of selected time stamps and a substitute set of optimal time stamps, to determine whether at least one of the substitute set of selected time stamps is newer than the substitute set of optimal time stamps. In one embodiment, the substitute set of selected time stamps includes a mix of first time stamps and second time stamps. The mix of first time stamps includes the first time stamps of selected entries that do not fall within the temporal window, and the second time stamps include the second time stamps of selected entries having first time stamps that do fall within the temporal window.

In other words, while the selected set of entries does not change in the analysis of a write operation to a memory table, the time stamps analyzed, among the first and second time stamps, may change based on whether the first time stamps of the entries fall within the temporal window. Likewise, the substitute set of optimal time stamps includes a mix of first time stamps and second time stamps. And while the optimal set of entries does not change, the time stamps analyzed of the optimal set of entries, among the first and second time stamps, may change. The mix of first time stamps includes the first time stamps of optimal entries that do not fall within the temporal window, and the second time stamps include the second time stamps of optimal entries having first time stamps that do fall within the temporal window.

If at least one of the time entries of the substitute set of selected time stamps is newer than the time entries of the substitute set of optimal entries, and if the optimal entries older than the substitute entries are outside the temporal window, then an optimization error is generated in block 309. Otherwise, if none of the time entries of the substitute set of selected time stamps is newer than the time entries of the substitute set of optimal entries, or if any of the substitute set of optimal entries which is older than any of the substitute set of selected time stamps is within the temporal window, the optimization analysis of the write operation to the memory table ends in block 306 with no error being generated.

While the determination of block 311 has been described with respect to a mix of first and second time stamps, it is understood that the substitute sets of selected and optimal time stamps may include only second time stamps in the event that each first time stamp among the selected entries or optimal entries falls within the temporal window.

While an embodiment has been described in which time stamps of individual entries are substituted, embodiments further include processes in which all the first time stamps of the selected or optimal set of entries are substituted by the second time stamps when any entry in the sets of selected or optimal entries is determined to fall within the temporal window. For example, in an embodiment in which the set of selected entries includes four entries, and in which the first time stamp of only one of the entries falls within the temporal window, the first time stamps of all of the entries may be substituted by the second time stamps. Similarly, in an embodiment in which the set of optimal entries includes four entries, and in which the first time stamp of only one of the entries falls within the temporal window, the first time stamps of all of the entries may be substituted by the second time stamps.

While embodiments are described in which sets of entries of a checking table are analyzed, it is understood that the process of analyzing sets and substituting time stamps may be performed one an entry-by-entry basis, by executing a loop function that executes until each entry of the checking table is analyzed, and appropriate time stamps substituted.

Referring to FIG. 2C, a table 200c is depicted in which an invalidation operation has occurred. In such an example, the clock cycle in which the operation occurred (column D, clock cycle 1114) is replaced with a value of "0." In such an embodiment, the first time stamp associated with column D may be the oldest time stamp, and the process illustrated in FIG. 3 may be performed accordingly. For example, if the write operation optimization test unit 108 were to detect a write operation to column F at clock cycle 1115, the write operation optimization test unit 108 may determine that the first time stamp of column F is not the oldest time stamp (column D has a substitute first time stamp of "0"; and column C has a first time stamp of 1110), the write operation optimization test unit 108 determines whether the first time stamp of column F is within the temporal window. In an example in which the temporal window is 10 clock cycles, the write operation optimization test unit 108 determines that the first time stamp of column F is within the temporal window (between clock cycle 1105 and 1115), and analyzes the second time stamp of column F. Since the second time stamp of column F (1104) is older than the second time stamp of column D (1110), which is the column having the oldest first time stamp (substitute value of "0" due to invalidation), no error would be generated. In other words, when a column is invalidated, the actual time stamp value (e.g. 1114 in col. 3) is used to compare the time value with the temporal window, but the invalidated time stamp value of "0" is used to compare the time stamp of the invalidated entry with other time stamps.

According to embodiments, a temporal window is provided to analyze the optimization of write operations to tables, such as hardware tables, implementing an LRU/MRU design. The temporal window makes some time stamps transparent to the analysis by substituting second time stamps of entries falling within the temporal window for the first time stamps. Accordingly, a level of robustness is added to a write operation testing and verification system, and the system may be prevented from performing an incorrect analysis of write operations while the write operations may still be on-going, for example.

Technical effects and benefits include validation of write operations to hardware memory structures without requiring direct copies of the hardware by using a temporal window.

In addition to one or more of the features described above, or as an alternative, determining whether to generate the optimization error may include determining that at least one selected entry is a recently-updated selected entry by determining that the first time stamp of the at least one selected entry falls within the temporal window. The determining may also include, based on determining that the first time stamp of the at least one entry falls within the temporal window, determining whether to generate the optimization error or to end the optimization analysis of the first write operation without generating the optimization error by comparing the second time stamp of the at least one selected entry with the first time stamps of the optimal entries of the optimal set of entries In addition to one or more of the features described above, or as an alternative, determining whether to generate the optimization error further includes determining that the second time stamp of the at least one selected entry in newer than the first time stamps of the optimal entries of the optimal set of entries and determining whether to generate the optimization error or to end the optimization analysis of the first write operation without generating the optimization error by comparing the second time stamp of the optimal entries of the optimal set of entries with the temporal window.

In addition to one or more of the features described above, or as an alternative, determining whether to generate the optimization error further includes determining whether to generate the optimization error or to end the optimization analysis of the first write operation without generating the optimization error by comparing a substitute set of selected time stamps with a substitute set of optimal time stamps, the substitute set of selected time stamps defined as the first time stamps of the selected set of entries that do not fall within the temporal window and the second time stamps of the selected set of entries corresponding to selected entries having first time stamps that fall within the temporal window, and the substitute optimal set of time stamps defined as the first time stamps of the optimal set of entries that do not fall within the temporal window and the second time stamps of the optimal set of entries corresponding to optimal entries having first time stamps that fall within the temporal window. The determination may further include, based on determining that at least one time stamp of the substitute selected set of time stamps is newer than each time stamp of the substitute optimal set of time stamps, generating the optimization error, and based on determining that each time stamp of the substitute selected set of time stamps is older than or the same as the time stamps of the substitute optimal set of time stamps, generating no optimization error and ending the optimization analysis of the first write operation.

In addition to one or more of the features described above, or as an alternative, embodiments may further include determining that no selected entry is a recently-updated selected entry by determining that the first time stamp of no selected entry among the set of selected entries falls within the temporal window and, based on determining that no selected entry is a recently-updated selected entry, determining whether to generate the optimization error or to end the optimization analysis of the first write operation without generating the optimization error by comparing the second time stamp of the optimal entries of the optimal set of entries with the temporal window.

In addition to one or more of the features described above, or as an alternative, determining whether to generate the optimization error may further include determining whether to generate the optimization error or to end the optimization analysis of the first write operation without generating the optimization error by comparing a the first time stamps of the selected set of entries with a substitute set of optimal time stamps, the substitute optimal set of time stamps defined as the first time stamps of the optimal set of entries that do not fall within the temporal window and the second time stamps of the optimal set of entries corresponding to optimal entries having first time stamps that fall within the temporal window. The determining may further include, based on determining that at least one first time stamp of the selected set of time stamps is newer than each time stamp of the substitute optimal set of time stamps, generating the optimization error. The determining may further include, based on determining that each time stamp of the selected set of time stamps is older than or the same as the time stamps of the substitute optimal set of time stamps, generating no optimization error and ending the optimization analysis of the first write operation.

In addition to one or more of the features described above, or as an alternative, the temporal window may be defined by a predetermined number of clock cycles, and the first and second time stamps are represented in the checking table as clock cycles.

In addition to one or more of the features described above, or as an alternative, in some embodiments the predetermined number of clock cycles is in a range from 5 clock cycles to 30 clock cycles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 4:
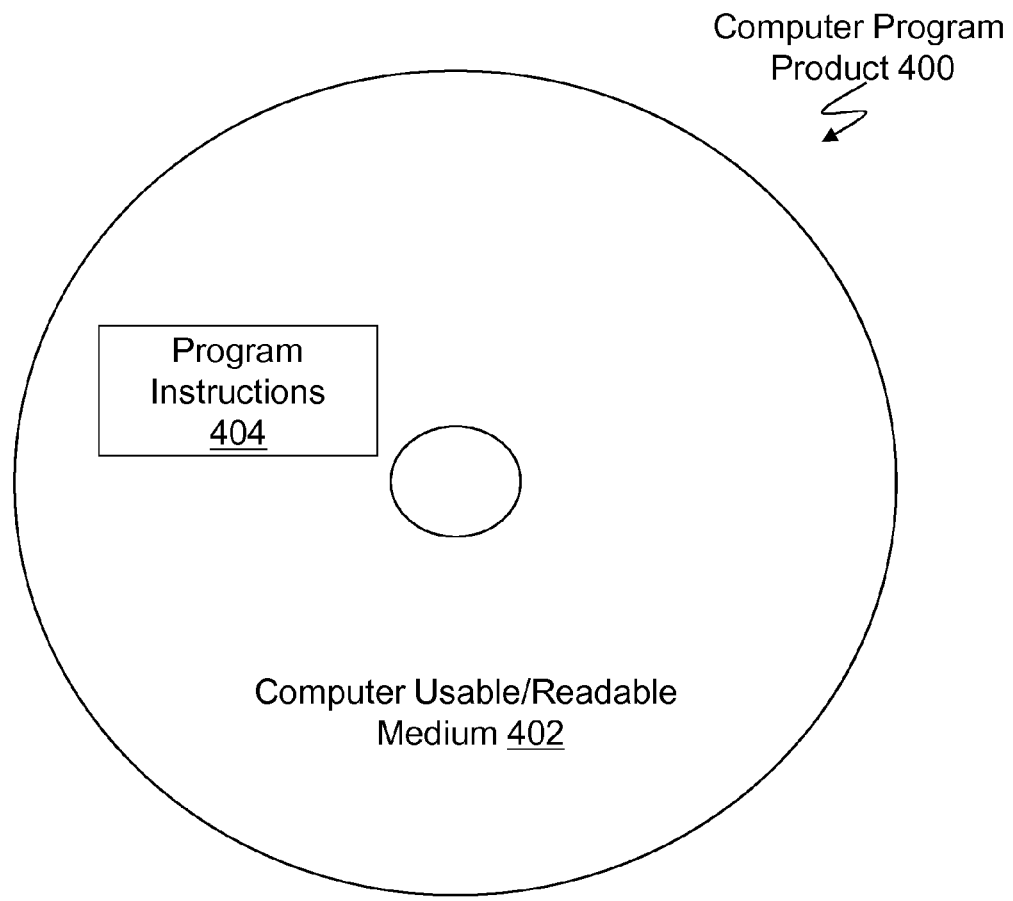
FIG. 4 depicts a computer-readable medium according to an embodiment.

Referring now to FIG. 4, in one example, a computer program product 400 includes, for instance, one or more storage media 402, wherein the media may be tangible and/or non-transitory, to store computer readable program instructions 404 thereon to provide and facilitate one or more aspects of embodiments described herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product for testing optimization of a microprocessor table function, the computer program product comprising:
  a computer readable storage medium having program instructions embodied therewith, wherein the computer readable storage medium is not a signal, the program instructions readable by a processing circuit to cause the processing circuit to perform a method comprising:
  storing in memory a checking table comprising a plurality of entries based on divisions of a memory table, the divisions including at least one of columns and rows, and the divisions of the memory table corresponding to data stored in memory having been used in processing operations, the checking table including a first time stamp for each of the entries, the first time stamp corresponding to a time the divisions of the memory table were last written to, and the checking table further including a second time stamp for each of the entries of the checking table, the second time stamp corresponding to a penultimate time the divisions of the memory table were written to;
  detecting, by the processing circuit, a first write operation to a set of "n" divisions in the memory table, and defining a selected set of entries of the checking table corresponding to the set of "n" divisions of the memory table;
  determining, by the processing circuit, that at least one selected entry of the selected set of entries is not among an optimal set of entries of the checking table, the optimal set of entries including at least the "n" oldest entries of the checking table and every entry having a first time stamp equal to a newest one of the "n" oldest entries;
  based on determining that the at least one selected entry is not among the optimal set of entries, determining whether to generate an optimization error or to end an optimization analysis of the first write operation without generating the optimization error by comparing the first time stamps of one or both of the at least one selected entry and one or more optimal entries of the optimal set of entries to a temporal window defined by a predetermined duration.

2. The computer program product of claim 1, wherein determining whether to generate the optimization error comprises:
  determining that at least one selected entry is a recently-updated selected entry by determining that the first time stamp of the at least one selected entry falls within the temporal window; and
  based on determining that the first time stamp of the at least one entry falls within the temporal window, determining whether to generate the optimization error or to end the optimization analysis of the first write operation without generating the optimization error by comparing the second time stamp of the at least one selected entry with the first time stamps of the optimal entries of the optimal set of entries.

3. The computer program product of claim 2, wherein determining whether to generate the optimization error further comprises:
  determining that the second time stamp of the at least one selected entry in newer than the first time stamps of the optimal entries of the optimal set of entries;
  based on determining that the second time stamp of the at least one selected entry is newer than the time stamps of the optimal entries of the optimal set of entries, determining whether to generate the optimization error or to end the optimization analysis of the first write operation without generating the optimization error by comparing the second time stamp of the optimal entries of the optimal set of entries with the temporal window.

4. The computer program product of claim 3, wherein determining whether to generate the optimization error further comprises:
  determining whether to generate the optimization error or to end the optimization analysis of the first write operation without generating the optimization error by comparing a substitute set of selected time stamps with a substitute set of optimal time stamps, the substitute set of selected time stamps defined as the first time stamps of the selected set of entries that do not fall within the temporal window and the second time stamps of the selected set of entries corresponding to selected entries having first time stamps that fall within the temporal window, and the substitute optimal set of time stamps defined as the first time stamps of the optimal set of entries that do not fall within the temporal window and the second time stamps of the optimal set of entries corresponding to optimal entries having first time stamps that fall within the temporal window;

based on determining that at least one time stamp of the substitute selected set of time stamps is newer than each time stamp of the substitute optimal set of time stamps, generating the optimization error; and based on determining that each time stamp of the substitute selected set of time stamps is older than or the same as the time stamps of the substitute optimal set of time stamps, generating no optimization error and ending the optimization analysis of the first write operation.

5. The computer program product of claim 1, further comprising:

determining that no selected entry is a recently-updated selected entry by determining that the first time stamp of no selected entry among the set of selected entries falls within the temporal window; and based on determining that no selected entry is a recently-updated selected entry, determining whether to generate the optimization error or to end the optimization analysis of the first write operation without generating the optimization error by comparing the second time stamp of the optimal entries of the optimal set of entries with the temporal window.

6. The computer program product of claim 5, wherein determining whether to generate the optimization error further comprises:

determining whether to generate the optimization error or to end the optimization analysis of the first write operation without generating the optimization error by comparing a the first time stamps of the selected set of entries with a substitute set of optimal time stamps, the substitute optimal set of time stamps defined as the first time stamps of the optimal set of entries that do not fall within the temporal window and the second time stamps of the optimal set of entries corresponding to optimal entries having first time stamps that fall within the temporal window;

based on determining that at least one first time stamp of the selected set of time stamps is newer than each time stamp of the substitute optimal set of time stamps, generating the optimization error; and based on determining that each time stamp of the selected set of time stamps is older than or the same as the time stamps of the substitute optimal set of time stamps, generating no optimization error and ending the optimization analysis of the first write operation.

7. The computer program product of claim 1, wherein the temporal window is defined by a predetermined number of clock cycles, and the first and second time stamps are represented in the checking table as clock cycles.

8. A computer program product for testing optimization of a microprocessor table function, the computer program product comprising:

a computer readable storage medium having program instructions embodied therewith, wherein the computer readable storage medium is not a signal, the program instructions readable by a processing circuit to cause the processing circuit to perform a method comprising:

storing in memory a checking table comprising a plurality of entries based on divisions of a memory table, the divisions including at least one of columns and rows, and the divisions of the memory table corresponding to data stored in memory having been used in processing operations, the checking table including a first time stamp for each of the entries, the first time stamp corresponding to a time the divisions of the memory table were last written to, and the checking table further including a second time stamp for each of the entries of the checking table, the second time stamp corresponding to a penultimate time the divisions of the memory table were written to;

detecting, by the processing circuit, a first write operation to a set of "n" divisions in the memory table, and defining a selected set of entries of the checking table corresponding to the set of "n" divisions of the memory table;

determining, by the processing circuit, that at least one selected entry of the selected set of entries is not among an optimal set of entries of the checking table, the optimal set of entries including at least the "n" oldest entries of the checking table and every entry having a first time stamp equal to a newest one of the "n" oldest entries;

based on determining that the at least one selected entry is not among the optimal set of entries, determining whether to generate an optimization error or to end an optimization analysis of the first write operation without generating the optimization error by comparing the first time stamps of one or both of the at least one selected entry and one or more optimal entries of the optimal set of entries to a temporal window defined by a predetermined duration, wherein the predetermined number of clock cycles is in a range from 5 clock cycles to 30 clock cycles.

9. A computer implemented method for testing optimization of a microprocessor table function, the method comprising:

storing in memory a checking table comprising a plurality of entries based on divisions of a memory table, the divisions including at least one of columns and rows, and the divisions of the memory table corresponding to data stored in memory having been used in processing operations, the checking table including a first time stamp for each of the entries, the first time stamp corresponding to a time the divisions of the memory table were last written to, and the checking table further including a second time stamp for each of the entries of the checking table, the second time stamp corresponding to a penultimate time the divisions of the memory table were written to;

detecting, by a processing circuit, a first write operation to a set of "n" divisions in the memory table, and defining a selected set of entries of the checking table corresponding to the set of "n" divisions of the memory table;

determining, by the processing circuit, that at least one selected entry of the selected set of entries is not among an optimal set of entries of the checking table, the optimal set of entries including at least the "n" oldest entries of the checking table and every entry having a first time stamp equal to a newest one of the "n" oldest entries;

based on determining that the at least one selected entry is not among the optimal set of entries, determining whether to generate an optimization error or to end an optimization analysis of the first write operation without generating the optimization error by comparing the first time stamps of one or both of the at least one selected entry and one or more optimal entries of the optimal set of entries to a temporal window defined by a predetermined duration.

10. The computer program product of claim 9, wherein determining whether to generate the optimization error comprises:
   determining that at least one selected entry is a recently-updated selected entry by determining that the first time stamp of the at least one selected entry falls within the temporal window; and
   based on determining that the first time stamp of the at least one entry falls within the temporal window, determining whether to generate the optimization error or to end the optimization analysis of the first write operation without generating the optimization error by comparing the second time stamp of the at least one selected entry with the first time stamps of the optimal entries of the optimal set of entries.

11. The computer program product of claim 10, wherein determining whether to generate the optimization error further comprises:
   determining that the second time stamp of the at least one selected entry in newer than the first time stamps of the optimal entries of the optimal set of entries;
   based on determining that the second time stamp of the at least one selected entry is newer than the time stamps of the optimal entries of the optimal set of entries, determining whether to generate the optimization error or to end the optimization analysis of the first write operation without generating the optimization error by comparing the second time stamp of the optimal entries of the optimal set of entries with the temporal window.

12. The computer program product of claim 11, wherein determining whether to generate the optimization error further comprises:
   determining whether to generate the optimization error or to end the optimization analysis of the first write operation without generating the optimization error by comparing a substitute set of selected time stamps with a substitute set of optimal time stamps, the substitute set of selected time stamps defined as the first time stamps of the selected set of entries that do not fall within the temporal window and the second time stamps of the selected set of entries corresponding to selected entries having first time stamps that fall within the temporal window, and the substitute optimal set of time stamps defined as the first time stamps of the optimal set of entries that do not fall within the temporal window and the second time stamps of the optimal set of entries corresponding to optimal entries having first time stamps that fall within the temporal window;
   based on determining that at least one time stamp of the substitute selected set of time stamps is newer than each time stamp of the substitute optimal set of time stamps, generating the optimization error; and
   based on determining that each time stamp of the substitute selected set of time stamps is older than or the same as the time stamps of the substitute optimal set of time stamps, generating no optimization error and ending the optimization analysis of the first write operation.

13. The computer program product of claim 9, further comprising:
   determining that no selected entry is a recently-updated selected entry by determining that the first time stamp of no selected entry among the set of selected entries falls within the temporal window; and
   based on determining that no selected entry is a recently-updated selected entry, determining whether to generate the optimization error or to end the optimization analysis of the first write operation without generating the optimization error by comparing the second time stamp of the optimal entries of the optimal set of entries with the temporal window.

\* \* \* \* \*